United States Patent [19]

Szekely et al.

[11] Patent Number: 4,999,060

[45] Date of Patent: Mar. 12, 1991

[54] SOLAR CELL PACKAGING ASSEMBLY FOR SELF-CONTAINED LIGHT

[75] Inventors: Klara Szekely, West Hills; Bethanne Felder; Lloyd V. Wallace, both of Thousand Oaks, all of Calif.

[73] Assignee: Siemens Solar Industries, L.P., Camarillo, Calif.

[21] Appl. No.: 392,502

[22] Filed: Aug. 11, 1989

[51] Int. Cl.$^5$ ............................................. H01L 31/048
[52] U.S. Cl. .................................... 136/251; 136/259; 136/291; 362/183
[58] Field of Search .................... 136/251, 259, 291; 362/183

[56] References Cited

U.S. PATENT DOCUMENTS

| | | | |
|---|---|---|---|
| 4,057,439 | 11/1977 | Lindmayer | 136/251 |
| 4,241,493 | 12/1980 | Andrulitis et al. | 437/2 |
| 4,280,853 | 7/1981 | Palazzetti et al. | 136/246 |
| 4,321,417 | 3/1982 | Kurth et al. | 136/246 |

Primary Examiner—Aaron Weisstuch
Attorney, Agent, or Firm—Nilsson, Robbins Dalgarn, Berliner Carson & Wurst

[57] ABSTRACT

A self-contained photovoltaic powered light which is a stand alone unit. The solar cells which power the light are assembled and maintained within the top, or upper, portion of the self-contained unit. The solar cells are encapsulated within a resiliently deformable material to provide for contraction and expansion of the solar cells while at the same time providing protection from the elements for the assembly.

5 Claims, 3 Drawing Sheets

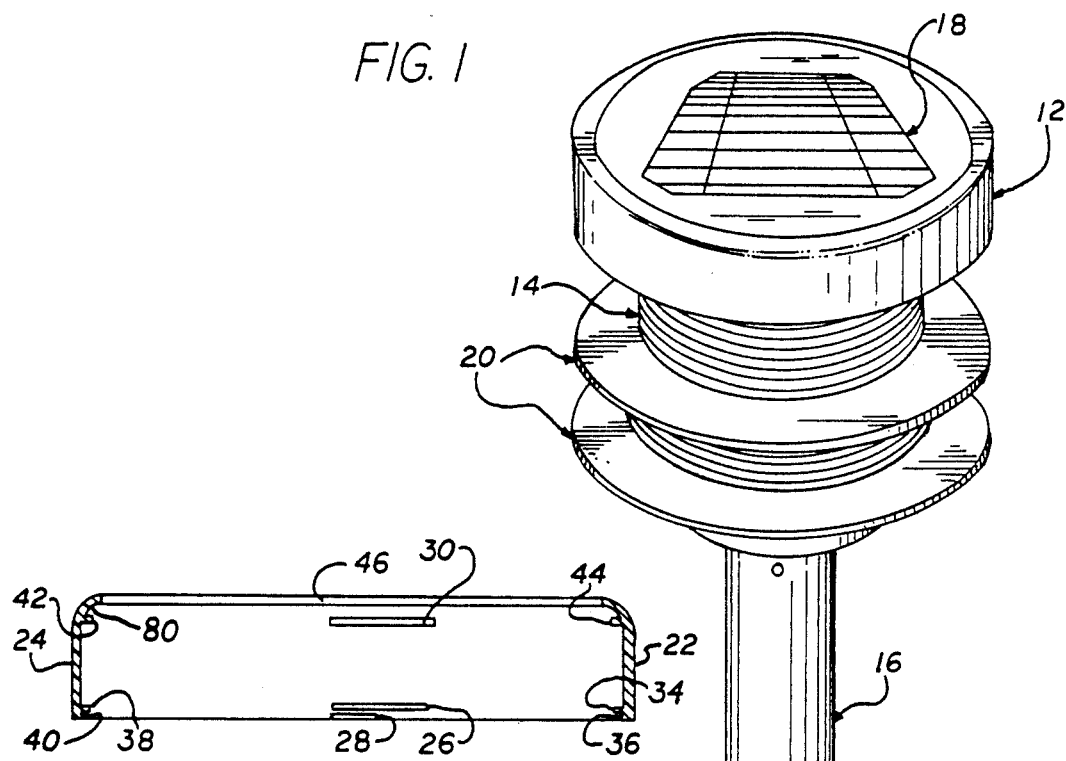
FIG. 1
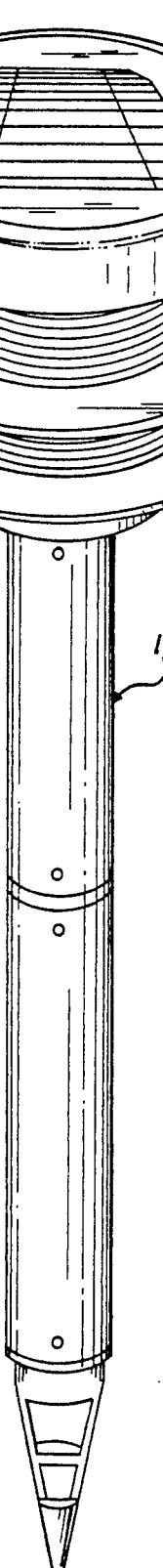
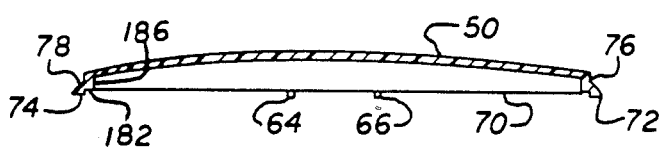
FIG. 3
FIG. 4

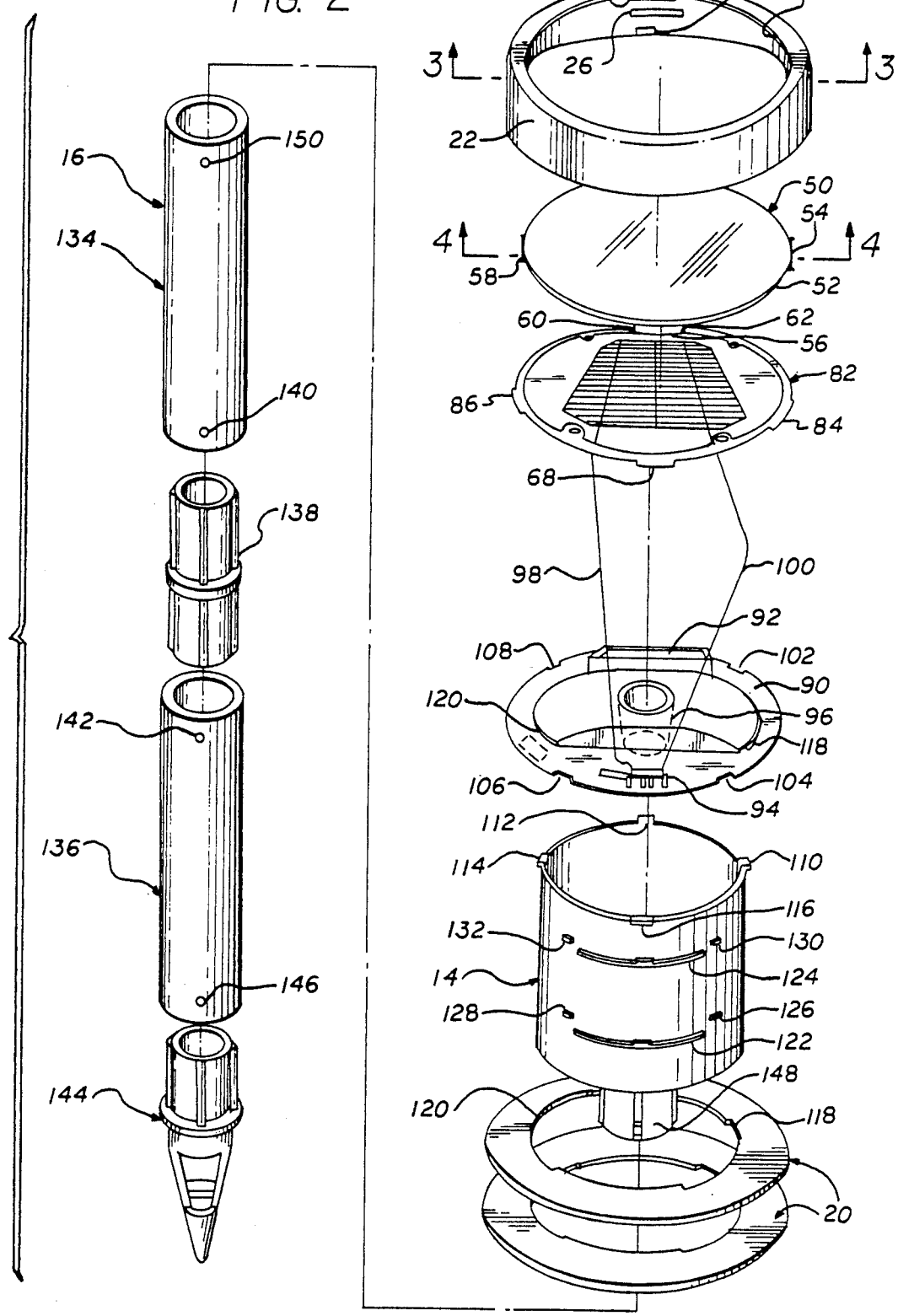

SOLAR CELL PACKAGING ASSEMBLY FOR SELF-CONTAINED LIGHT

BACKGROUND OF THE INVENTION

This invention relates generally to lighting devices and more particularly to a self-contained photovoltaic powered light. More specifically, the invention is directed to a packaging assembly for the solar cells.

In the prior art, there exists many electrically powered outdoor lighting systems which are utilized to illuminate pathways, yards, certain areas of parks, or other predetermined areas. Typically such lights are connected to the public utility system, or similar source of electrical power and are controlled by preset timing devices so that they illuminate at nightfall and extinguish at a predetermined time, such as approaching daybreak, or the like. Such lights require extensive cabling, including conduits as well as appropriate timing mechanisms and are thus relatively expensive to install and maintain. In addition thereto, by utilizing electric power generated in the traditional manners, such as by the burning of fossil fuels, additional contamination of the environment occurs as well as depletion of fossil fuel sources. Therefore, there is a need to provide a source of illumination for predetermined outdoor areas which does not require connection to a public utility source of power or the like and which is relatively easy and inexpensive to install and requires no maintenance.

SUMMARY OF THE INVENTION

A solar packaging assembly including a tray having a floor and a side wall. A plurality of electrically interconnected solar cells are disposed within the tray. The solar cells are surrounded by an optically clear, resiliently deformable material supported upon the floor of the tray and retained within the side walls thereof.

BRIEF DESCRIPTION OF THE DRAWINGS

FIG. 1 is a perspective view illustrative of a light constructed in accordance with the principles of the present invention;

FIG. 2 is an exploded view showing the various component parts of the structure as illustrated in FIG. 1;

FIG. 3 is a cross-sectional view of the bezel taken about the lines 3—3 of FIG. 2;

FIG. 4 is a cross-sectional view of the cover taken about the lines 4—4 of FIG. 2;

DETAILED DESCRIPTION

Figure 5:
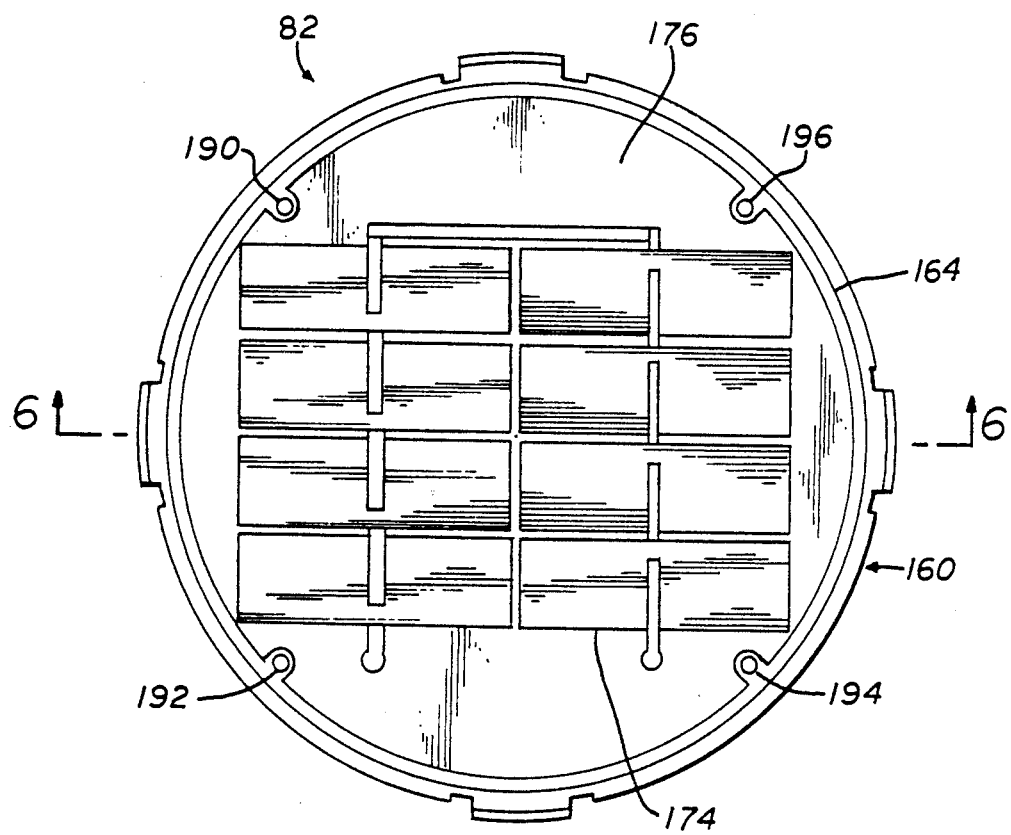
FIG. 5 is a top plan view illustrating the encapsulation of the solar cells.

The self-contained lamp 10 is illustrated in FIG. 1 and is a stand alone lamp which includes a self-contained electrical power source such as a battery which is maintained in a charged condition by a solar cell array and includes an electrical circuit which controls application of electrical power to an electric light bulb contained therein. The electrical power from the battery is supplied to the light bulb when the solar cell array is not producing electricity, that is, when the ambient light falls below a predetermined level. The lamp 10 includes top portion 12 having a lens 14 affixed thereto. A stake 16 is, in turn, attached to the lens 14 and is used to position the lamp 10 in the desired area such, for example, as by inserting the stake 16 into the earth. A solar cell assembly 18 is retained within the top portion 12 while decorative disks 20 are retained upon the lens 14. The entire lamp assembly 10, as illustrated in FIG. 1, may be moved from place to place and positioned at any particular point which may be desired for any particular application. For example, a plurality of the lamps 10 may be positioned to illuminate a pathway as well as to delineate the same. In addition, such a plurality of lamps 10 may be placed to illuminate a given area during nighttime hours.

By reference to FIG. 2, a more detailed understanding of the structure of the lamp 10 may be obtained. The upper portion 12 of the lamp includes a bezel 22 which is preferably constructed of a molded plastic, such as ASA (acrylic styrene acrylonitrile) or the like, which is sturdy yet somewhat flexible for the purposes to be described below.

The bezel 22 defines an inner surface 24 from which there inwardly extends a plurality of spaced apart latching ribs as shown at 26 and 28. Similar ribs, such as those illustrated at 26 and 28, are angularly disposed about the inner surface 24 of the bezel 22. Preferably, the latching ribs are disposed at 90° intervals about the surface 24; however, they may be disposed at different angular positions such as 120° or 60° depending upon the number desired. Also inwardly directed from the surface 24 are a plurality of snap lock retainers as shown at 30. Again, such snap lock retainers are angularly disposed about the surface 24 and preferably at 90° intervals although other intervals may be utilized as desired.

The bezel 22 also defines an upper opening 32 within which the solar cell array is disposed to receive the sunlight during daylight hours to charge the battery contained within the light. The details of construction of the bezel 22 may be better understood by reference to FIG. 3 which more clearly shows the position and relationships of the latching ribs and the snap lock retainer. As is therein shown, additional latching ribs 34, 36, 38 and 40 are shown extending inwardly from the inner surface 24 of the bezel 22. Additional snap lock retainers 42 and 44 are also illustrated. As is more clearly shown in FIG. 3, the snap lock retainer 30 is displaced downwardly from the edge 46 of the bezel which defines the opening 32. As will be described more fully hereinafter, such spacing permits the solar cell assembly 18 to be snapped into place within the bezel 22 and securely held there.

By reference, again, to FIG. 2 and also to FIG. 4, there is illustrated a cover which fits over the solar cells and which forms a part of the solar cell assembly. The cover 50 is optically clear and is preferably constructed of a polycarbonate plastic material which is impact resistant. The polycarbonate material thus protects the solar cells from incidental contact and also from dust. As is shown, the cover 50, at its outer rim 52, includes a plurality of lugs as shown at 54, 56 and 58. Each of the lugs includes spaced apart protrusions as shown at 60 and 62 with respect to the lug 56. Again, the lugs are angularly disposed about the cover 50 and preferably at 90° spacing to match the spacing of the snap lock retainers 30 formed on the bezel 22. The protrusions 60 and 62, when the cap 50 is positioned in place within the bezel 22, are spaced one on each side of a snap lock tongue formed on the solar cell assembly such, for example, as shown at 68 and to be described more fully below. As is more clearly shown in FIG. 4, the protrusions 64 and 66 extend below the lower rim 70 of the cap 50. Further protrusions are shown at 72 and 74 and are those associated with the lugs 54 and 58 respectively. The general curvature of the cap 50 is also further and better illustrated in FIG. 4. As is also shown in FIG. 4, the cap 50 includes a step 76 in the periphery thereof. The step 76 fits within the opening 32 and conforms to the upper edge 46 of the bezel 22. The step 76 terminates in a ledge 78 which snugly mates against the upper portion 80 of the inner surface 24 of the bezel 22. Such fit provides a seal against the entry of moisture into the solar cell assembly.

The solar cell assembly 82, along with the cap 50, are assembled together and snapped into the bezel 22. Additional locking tongues 84 and 86 displaced 90° from the tongue 68 are illustrated and an additional locking tongue, not shown, is disposed 180° from the tongue 68. As with the other protrusions, extension ribs and the like, the angular displacement of the locking tongues may be any desired. In any event, the displacement is such that the locking tongues on the solar cell assembly 82 mate with the snap lock retainers 30, 42 and 44 on the inner surface 24 of the bezel 22. For assembly, the cap 50 is placed so that the protrusions 56 and 60 fall outside the tongues 68, thus securely and snugly fitting the cap over the solar cell assembly 82. The combination is then inserted into the bezel 22 and the locking tongues 68, 84 and 86 are snapped into place in the space provided between the upper edge 46 and the snap lock retainers 30, 42 and 44. The ability to snap the combination of the cover 50 and the solar cell assembly into place is provided by the flexibility of the molded plastic forming the bezel 22. A more detailed explanation of the encapsulation of the solar cells to form the solar cell assembly 82 will be provided below.

A component tray assembly 90 is provided to receive a battery 92 and electrical circuit assembly 94 and light bulb (not shown) in a central aperture 96. The tray 90 is interconnected by electrical wires 98 and 100 to the solar cell assembly 82 so that electrical power may be provided from the solar cells to the battery 92 to maintain the same in a charged condition. The battery also, through the provision of the circuit assembly provides electrical power to the light when the solar cells are not generating electrical energy. The component tray assembly 90 includes notches 102, 104, 106 and 108 which are used to locate the component tray assembly 90 within the space between the spaced apart locking ribs 26, 28, 34, 36, 38 and 40. The tray may then be rotated and secured in position at the bottom portion of the bezel 22. The lower surface of the component tray assembly 90 then closes the bottom of the bezel 22 to provide a completed assembly.

The lens 14 includes outwardly extending latching fingers 110, 112, 114 and 116. Such fingers are inserted within openings as shown at 118 and 120 and the lens is rotated appropriately to latch the same in place so as to extend downwardly from the component tray assembly 90. The disks 20 are assembled upon the outer surface of the lens 14 by slipping the openings as illustrated at 118 and 120 over outwardly extending sectors 122 and 124 and then rotating the disks so that they occupy the space between the sectors 122 and 124 and the stops 126 and 128 associated with the sector 122 and the stops 130 and 132 associated with the sector 124.

The stake 16 is assembled by inserting the body portions 134 and 136 over the central coupling 138 and securing the same by the use of screws inserted into the openings as illustrated at 140 and 142. Similarly, the tip 144 may be inserted into the bottom of the body portion 136 and secured in place by a screw positioned within the opening 146. The entire assembly is then inserted over the protrusion 148 provided at the bottom of the lens 14 and held in place by a screw inserted through the opening 150 in the body portion 134 of the stake 16. Obviously, if such is desired to cause the lamp 10 to extend a lesser distance from the surface, the coupling 138 and the body portion 136 may be discarded.

Figure 6:
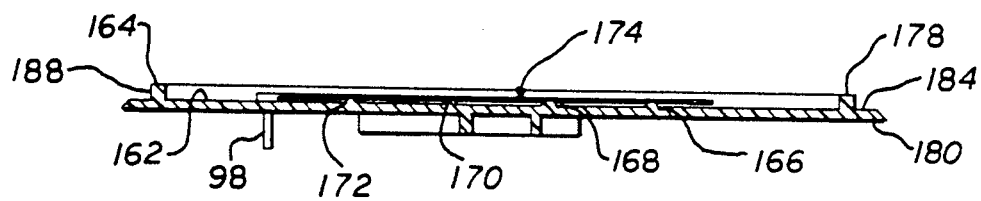
FIG. 6 is a cross-sectional view of the solar cell encapsulation taken about the lines 6—6 of FIG. 5.

As is illustrated more fully in FIGS. 5 and 6, the solar cell assembly 82 includes a tray 160 having a floor 162 and an upstanding wall 164. Protruding upwardly from the floor 162 is a plurality of stand-offs, such as shown at 166, 168, 170 and 172. The stand-offs 166 through 172 take the form of a plurality of bumps which are spaced apart on the floor 162. Any number of stand-offs may be utilized as desired so as to space the solar cells 174 away from the floor 162 of the tray 160. Subsequent to appropriate positioning of the solar cells 174 upon the stand-offs, as is illustrated particularly in FIGS. 5 and 6, a potting compound 176 is poured into the tray 160 within the wall 164 so as to cover and surround the solar cells 174. The potting compound 176 extends preferably up to the upper edge 178 of the wall 164 and thus completely covers the upper surface of the solar cells 174. The potting compound 176 is preferably silicone which is optically clear and is in its cured state resiliently deformable.

After the potting compound has been poured in place, it is heated along with the tray and the solar cells in an oven at between 80° C. and 90° C. for approximately 2 hours to cause it to cure and set. The potting compound 176 is also ultraviolet inhibited so that it does not turn color when exposed to the sun. The resiliently deformability of the potting compound 176 is important to the present invention. Such resilient deformability allows expansion and contraction of the solar cells 174 without subjecting them to cracking, thus providing a long life for the lamp. Appropriate electrical leads, one of which is shown at 98, extends through an opening provided in the floor 162 of the tray 160 to provide the electrical power as above described.

By particular reference to FIG. 6, it may be seen that the tray 160 includes an outwardly extending peripheral rim 180 which extends outwardly from the wall 164. Through the utilization of the rim 180 along with the step 76 and ledge 78 there is provided an additional seal for the solar cells which precludes moisture from contacting the upper surface thereof. Such occurs through the mating of the cap 50. The lower rim 182 thereof seats upon the ledge 184 formed by the rim 180 while the inner surface 186 of the cap 50 mates with the vertical surface 188 of the wall 164. Through these mating surfaces, it will be appreciated that for moisture to enter and accumulate on the upper surface of the potting compound 176, and thus over the surface of the solar cells, it must enter by traveling sideways between the surfaces 184 and 182 of the tray and cap and then upwardly along the surfaces 186 and 188 of the cap and tray. It has been observed that such a tortuous path effectively eliminates the travel of the moisture into the interior portion of the solar cell assembly. As will be noted particularly with respect to FIG. 5, the solar cell assembly also defines a plurality of openings 190, 192, 194 and 196 so that the interior of the assembly may be vented to the exterior, thereby precluding moisture condensation within the solar cell assembly.

It will be appreciated by those skilled in the art that the solar cells utilized in the solar cell assembly 174 may be any as desired and well known to those skilled in the art. The manufacture of such cells is well known and will not be described herein. Such cells are readily available on the open market from a variety of sources. Preferably those used with the present structure are formed from single crystal silicon appropriately treated to provide a photovoltaic cell. Although the present invention has been described in conjunction with a pathway light which is essentially cylindrical in shape, it will be understood and recognized by those skilled in the art that the particular geometric configuration of the solar cell packaging assembly may take any form desired for the particular application. The packaging assembly will, in each instance, include the optically clear silicone potting compound which provides the resiliently deformable encapsulation for the solar cells to permit expansion and contraction thereof. In addition, the tray and cap will, in each instance, provide the mating surfaces therebetween so as to provide the tortuous path through which moisture must travel to enter the solar cell packaging assembly.

There has thus been disclosed a self-contained solar powered lamp which may be utilized to eliminate or delineate any particular area desired.

We claim:

1. A solar cell packaging assembly comprising:
   a tray including a floor and a side wall;
   a plurality of electrically interconnected solar cells disposed within said tray;
   an optically clear material substantially surrounding said solar cells and contained within said sidewall to secure said cells within said tray, said material being resiliently deformable to permit said cells to expand and contract without damage; and
   a transparent cover over said solar cells, said cover being received by said tray at mutually contacting surfaces, said contacting surfaces between said tray and said cover defining a first horizontal plane and a second vertical plane orthogonally adjoining each other, said horizontal plane being disposed below said vertical plane, thereby substantially excluding the entry of moisture by providing a tortuous path for the entry of moisture into said assembly.

2. A solar cell packaging assembly as defined in claim 1 which further includes a bezel having an inner surface, a plurality of snap lock retainers extending inwardly from said inner surface and angularly disposed thereabout, said tray and cover being retained within said bezel by said snap lock retainers.

3. A solar cell packaging assembly as defined in claim 2 wherein said tray includes a plurality of outwardly extending protrusions at the periphery thereof, each of said protrusions being received within a snap lock retainer to secure said tray within said bezel.

4. The solar cell packaging assembly as defined in claim 3 wherein said tray defines openings extending therethrough to provide circulation with the ambient to preclude condensation of moisture internally of said assembly.

5. The solar cell packaging assembly as defined in claim 4 wherein said tray includes means for electrically contacting said solar cells and to convey electrical energy generated by said solar cells through said tray for use in energizing electrical energy utilizing means.

* * * * *